United States Patent
Hirai et al.

(10) Patent No.: US 7,691,562 B2
(45) Date of Patent: Apr. 6, 2010

(54) METHOD FOR FORMING FILM PATTERN, AND METHOD FOR MANUFACTURING DEVICE, ELECTRO-OPTICAL DEVICE, ELECTRONIC APPARATUS AND ACTIVE MATRIX SUBSTRATE

(75) Inventors: Toshimitsu Hirai, Chino (JP); Katsuyuki Moriya, Azumino (JP)

(73) Assignee: Seiko Epson Corporation (JP)

( * ) Notice: Subject to any disclaimer, the term of this patent is extended or adjusted under 35 U.S.C. 154(b) by 743 days.

(21) Appl. No.: 11/458,531

(22) Filed: Jul. 19, 2006

(65) Prior Publication Data
US 2007/0020834 A1 Jan. 25, 2007

(30) Foreign Application Priority Data
Jul. 20, 2005 (JP) ............................. 2005-210652
Mar. 23, 2006 (JP) ............................. 2006-080303

(51) Int. Cl.
*H01L 21/00* (2006.01)
(52) U.S. Cl. ..................... 430/313; 430/315; 438/725
(58) Field of Classification Search .................. 438/21, 438/618, 706, 712, 723, 724, 725, 745; 216/67, 216/74, 13; 430/312, 325, 313, 315; 427/98.8
See application file for complete search history.

(56) References Cited

U.S. PATENT DOCUMENTS

| | | | |
|---|---|---|---|
| 5,606,179 A | 2/1997 | Yamazaki et al. | |
| 5,714,222 A * | 2/1998 | Yokoyama | ................. 428/64.1 |
| 6,521,913 B1 | 2/2003 | Murade | |
| 6,765,230 B2 | 7/2004 | Murade | |
| 6,770,909 B2 | 8/2004 | Murade | |
| 6,872,975 B2 | 3/2005 | Murade | |
| 7,015,503 B2 | 3/2006 | Seki et al. | |
| 7,214,959 B2 | 5/2007 | Seki et al. | |
| 7,273,801 B2 | 9/2007 | Seki et al. | |
| 2005/0007398 A1* | 1/2005 | Hirai | .............................. 347/1 |
| 2005/0042850 A1* | 2/2005 | Sakai et al. | .................. 438/597 |
| 2005/0186403 A1* | 8/2005 | Seki et al. | ................ 428/195.1 |
| 2005/0236983 A1* | 10/2005 | Sakai et al. | .................. 313/506 |
| 2006/0084206 A1* | 4/2006 | Moriya et al. | ................ 438/149 |
| 2006/0115983 A1* | 6/2006 | Fujii et al. | .................. 438/640 |
| 2007/0020899 A1* | 1/2007 | Hirai et al. | ................... 438/584 |

FOREIGN PATENT DOCUMENTS

| | | |
|---|---|---|
| JP | 11-274671 | 10/1999 |
| JP | 2000-216330 | 8/2000 |
| JP | 2005-012181 | 1/2005 |

* cited by examiner

*Primary Examiner*—Roberts Culbert
(74) *Attorney, Agent, or Firm*—Harness, Dickey & Pierce, P.L.C.

(57) ABSTRACT

A method for forming a film pattern, comprises: disposing a first bank forming material to a substrate so as to form a first bank layer; disposing a second bank forming material on the first bank layer so as to form a second bank layer; and patterning the first bank layer and the second bank layer so as to form a bank including a pattern forming region having a first pattern forming region and a second pattern forming region, the second pattern forming region having a width larger than a width of the first pattern forming region, and being continuously formed from the first pattern forming region, wherein the first bank layer has a sidewall facing the pattern forming region and a first contact angle of less than 50 degrees with respect to a functional liquid containing $H_2O$ on the sidewall, and the second bank layer has a second contact angle larger than the first contact angle with respect to the functional liquid.

12 Claims, 11 Drawing Sheets

METHOD FOR FORMING FILM PATTERN, AND METHOD FOR MANUFACTURING DEVICE, ELECTRO-OPTICAL DEVICE, ELECTRONIC APPARATUS AND ACTIVE MATRIX SUBSTRATE

BACKGROUND

1. Technical Field

The present invention relates to a method for forming a film pattern, and a method for manufacturing a device, an electro-optical device, an electronic apparatus, and an active matrix substrate.

2. Related Art

As a method for forming a wiring line, which has a predetermined pattern, and is used in electric circuits and integrated circuits, photolithography has been widely used. However, the photolithography needs large-scale equipment such as vacuum apparatuses and exposure apparatuses, and sophisticated processes to form the wiring line having a predetermined pattern. In addition, almost all of materials are wasted due to a low efficiency of about several percent in using the materials, resulting in high manufacturing costs.

Alternatively, a method is proposed in which a wiring line having a predetermined pattern is formed on a substrate using a droplet discharge method (called an inkjet method) in which a liquid material is discharged from a liquid discharge head as a droplet. For example, the method is disclosed in JP-A-11-274671 and JP-A-2000-216330. In the inkjet method, a liquid material (functional liquid) for a pattern is directly patterned on a substrate, and then the patterned material is subjected to heating or is irradiated by laser so as to form a desired pattern. Accordingly, the method has an advantage in that no photolithography is required, processes can be drastically simplified, and the amount of consumed raw material can be reduced since the row material can be directly applied on a patterning position.

Recently, circuits included in devices have been highly densified. This requests, for example, wiring lines to be further reduced in width. However, in the pattern forming method using the droplet discharge method described above, it is difficult to stably form a fine pattern since a discharged droplet spreads on a substrate after landing on the substrate. Particularly, when the pattern functions as a conductive film, spreading of the droplet causes a liquid pool (bulge), which may cause a failure such as wire breakage or short. As an alternative, a technique is proposed in JP-A-2005-12181. The technique employs a bank structure including a region for forming a wide width wiring line, and a region for forming a fine wiring line that is formed so as to be connected to the region for forming a wide width wiring line. In the technique, a functional liquid is discharged to the region for forming a wide width wiring line, so that the functional liquid flows into the region for forming a fine wiring line by a capillary phenomenon, thereby a fine wiring pattern is formed.

Here, if the difference is significant between the widths of the region for forming a fine wiring line and the region for forming a wide width wiring line, to which the functional liquid is discharged, the amount of functional liquid that flows into the region for forming a fine wiring line by a capillary phenomenon runs short. This is because that the functional liquid usually flows along a bank that defines the region for forming a wide width wiring line. As a result, a problem arises in that the film thickness of a formed fine wiring pattern is thinner than other wiring patterns.

As an alternative to increase the thickness of a fine wiring pattern, for example, a method can be employed in which a part of the width of the region for forming a wide width wiring line is narrowed so as to increase a flowing amount of a functional liquid into a region for forming a fine wiring line from the region for forming a wide width wiring line.

However, it is difficult to adequately control the flowing amount of the functional liquid in the above-described case where the amount of the functional liquid flowing into the region for forming a fine wiring line (a first pattern forming region) is increased by narrowing a part of the region for forming a wide width wiring line (pattern forming region). For example, if the function liquid flows into the region for forming a fine wiring line too much, the thickness of the fine pattern becomes thicker than those of others, resulting in a difference in thickness between the fine pattern and others.

As a result, if the technique is, for example, applied to form a gate wiring line and a gate electrode continued from the gate wiring line, stable transistor characteristics are hardly achieved due to the difference in thickness between the gate wiring line and the gate electrode.

SUMMARY

An advantage of the invention is to provide a method for forming a film pattern that can uniformly and stably form a film pattern by providing a functional liquid to a pattern forming region that includes regions having a different width.

A method for forming a film pattern according to a first aspect of the invention includes: disposing a first bank forming material to a substrate so as to form a first bank layer; disposing a second bank forming material on the first bank layer so as to form a second bank layer; and pattering the first bank layer and the second bank layer so as to form a bank including a pattern forming region having a first pattern forming region and a second pattern forming region. The second pattern forming region has a width larger than a width of the first pattern forming region, and is continuously formed from the first pattern forming region. The first bank layer has a sidewall facing the pattern forming region and a first contact angle of less than 50 degrees on the sidewall with respect to a functional liquid containing $H_2O$. The second bank layer has a second contact angle larger than the first contact angle with respect to the functional liquid.

According to the method, the functional liquid disposed in the pattern forming region can wet and spread with a specific shape since the first bank layer, which is disposed as a lower layer, has the first contact angle of less than 50 degrees with respect to the functional liquid on the sidewall of the first bank layer. Namely, the leading edge of the functional liquid that wets and spreads can have a concave shape, both parts of which extend in a spreading direction along the sidewalls of the pattern forming region in a plan view. This specific shape allows the functional liquid to spread uniformly and rapidly in the pattern forming region, and to be supplied into a narrow part rapidly and reliably by using a capillary phenomenon. As a result, a film pattern having a uniform thickness can be stably provided in a short period of time.

In the method, the pattern forming region preferably has a third contact angle, which is the first contact angle or less, with respect to the functional liquid on the bottom surface of the pattern forming region. The method allows the functional liquid to wet and spread uniformly on the entire surface of the pattern forming region, markedly contributing to form a uniform film pattern. If the third contact angle is larger than the first contact angle, the leading edge of the functional liquid, which wets and spreads, tends to have a convex shape in a plan view, thereby the functional liquid hardly wets and spreads uniformly.

In the method, the second contact angle is 50 degrees or more with respect to the functional liquid. This makes it possible to repel the functional liquid well on the second bank layer, which is disposed as an upper layer. The functional liquid can be kept well in the pattern forming region due to the difference in a contact angle between the first bank layer and the second bank layer. As a result, a film pattern having an accurate plan shape can be easily formed.

In the method, the first bank material is preferably composed of a main chain and a side chain. The main chain is preferably a carbon bond or a siloxane bond, and the side chain preferably includes at least one group chosen from the following: —H, —OH, —($CH_2CH_2O$)nH, —COOH, —COOK, —COONa, —$CONH_2$, —$SO_3H$, —$SO_3Na$, —$SO_3K$, —$OSO_3H$, —$OSO_3Na$, —$OSO_3K$, —$PO_3H_2$, —$PO_3Na_2$, —$PO_3K_2$, —$NO_2$, —$NH_2$, —$NH_3Cl$, —$NH_3Br$, ≡HNCl, and ≡NHBr. Using such bank material allows the first contact angle to be easily adjusted in less than 50 degrees.

In the method, the side chain may further include at least one of an alkyl group, an alkenyl group, and an aryl group. In the method, a material having a relatively low affinity with respect to an aqua based functional liquid can be used as long as the first contact angle can be adjusted in less than 50 degrees. Therefore, an organic group having a low affinity with respect to water can be included in a part of the side chain.

In the method, the second bank material is preferably composed of a main chain and a side chain. The main chain is preferably a carbon bond or a siloxane bond, and the side chain of the second bank material preferably includes at least one of an alkyl group, an alkenyl group, and an aryl group. Such material exhibits a low affinity with respect to an aqua based functional liquid, thereby the second contact angle can increase. As a result, the functional liquid can be more adequately trapped by the second bank layer.

In the method, a thickness of the second bank layer is preferably smaller than a thickness of the first bank layer. According to the method, a large volume of a functional liquid can be disposed in the pattern forming region, thereby a film pattern having a relatively thick thickness can be easily and uniformly formed.

The method may further includes: disposing a first functional liquid to the pattern forming region; drying the first functional liquid in the pattern forming region so as to form a first dried film; and disposing a second functional liquid on the first dried film. A thickness of the first dried film may be smaller than a thickness of the first bank layer.

Namely, the method can preferably be used for forming a film pattern having a multilayered structure. In the method, a film pattern having a multilayered structure can be efficiently formed since the first bank layer and the second layer are layered by adjusting each of the first contact angle and the second contact angle. Because of this, providing a lyophobic treatment such as a plasma treatment is not required between processes to form each layer when forming a film pattern having a multilayered structure, though lyophobicity is given by a plasma treatment in a related art forming method.

When forming a film pattern having a multilayered structure, the thickness of the first dried film is preferably thinner than that of the first bank layer so that the second functional liquid disposed on the surface of the first dried film also wets and spreads well. As a result, the second functional liquid can utilize an effect of the sidewall of the first bank to enhance a functional liquid to wet and spread.

The method may further include: disposing a functional liquid to the pattern forming region; drying the functional liquid in the pattern forming region so as to form a dried film; and firing the bank and the dried film at once.

The method can realize a reduction of a processing time in film forming processes since the firing process for only the bank can be omitted, thereby manufacturing efficiency of a device can be increased.

In the method, a plurality of dried films may be formed in the pattern forming region, and then the dried films and the bank may be fired at once.

Even if a film pattern to be formed has a multilayered structure, the bank and the film pattern can be fired at once, thereby efficiency in film pattern forming processes can be increased.

A device according to a second aspect of the invention includes: a bank formed on a substrate; a pattern forming region surrounded by the bank; and a film pattern formed on the pattern forming region. The bank, the pattern forming region, and the film pattern are formed by using the method for forming a film pattern according to the first aspect of the invention. The device is excellent in electrical characteristics with a very few occurrence of wire breakage, short, or the like, since the device is provided with a film pattern having a uniform film thickness.

The device may further include a gate wiring line that is the film pattern formed in the second pattern forming region according to the first aspect of the invention, and a gate electrode that is the film pattern formed in the first pattern forming region according to the first aspect of the invention. In the device, the film thickness of the gate wiring line can be nearly equal to that of the gate electrode by using the method for forming a film pattern according to the first aspect of the invention. Accordingly, characteristics of a transistor can be stabilized. As a result, a device provided with the transistor has high reliability.

The device may further include a source wiring line that is the film pattern formed in the second pattern forming region according to the first aspect of the invention, and a source electrode that is the film pattern formed in the first pattern forming region according to the first aspect of the invention. In the device, the film thickness of the source wiring line can be nearly equal to that of the source electrode by using the method for forming a film pattern according to the first aspect of the invention. Accordingly, characteristics of a transistor can be stabilized. As a result, a device provided with the transistor has high reliability.

An electro-optical device according to a third aspect of the invention includes the device according to the second aspect of the invention.

Since the electro-optical device is provided with a device having favorable electrical characteristics, an electro-optical device having improved quality and performance can be achieved.

Here, an electro-optical device is a collective term referring to the following devices: a device has an electro-optical effect by which electric field changes a refractive index of a substance so as to change a transmittance rate of light, a device converts electric energy into optical energy, and the like. Specifically, liquid crystal displays using liquid crystal as an electro-optical substance, organic EL devices using organic EL, inorganic EL devices using inorganic EL, and plasma displays using gas for plasma as an electro-optical substance are exemplified. In addition, electrophoretic displays (EPDs), and field emission displays (FEDs) are exemplified.

An electronic apparatus according to a fourth aspect of the invention includes the electro-optical device according to the third aspect of the invention.

The electronic apparatus has high reliability since it is provided with the electro-optical device having improved quality and performance.

A method for manufacturing an active matrix substrate according to a fifth aspect of the invention includes: (a) forming a gate wiring line on a substrate; (b) forming a gate insulation film on the gate wiring line; (c) depositing a semiconductor layer on the gate insulation film; (d) forming a source electrode and a drain electrode on the gate insulation film; (e) disposing an insulation material on the source electrode and the drain electrode; and (f) forming a pixel electrode on the insulation material. The method for forming a film pattern according to the first aspect of the invention is used in at least one of steps (a), (d), and (f).

A method for manufacturing an active matrix substrate according to a sixth aspect of the invention includes: (g) forming a source electrode and a drain electrode on a substrate; (h) forming a semiconductor layer on the source electrode and the drain electrode; (i) forming a gate electrode on the semiconductor layer with a gate insulation film interposed between the gate electrode and the semiconductor layer; and (j) forming a pixel electrode so as to be coupled to the drain electrode. The method for forming a film pattern according to the first aspect of the invention is used in at least one of steps (g), (i), and (j).

A method for manufacturing an active matrix substrate according to a seventh aspect of the invention includes: (k) forming a semiconductor layer on a substrate; (l) forming a gate electrode on the semiconductor layer with a gate insulation film interposed between the gate electrode and the semiconductor layer; (m) forming a source electrode so as to be coupled to a source region of the semiconductor layer through a first contact hole formed in the gate insulation film, and a drain electrode so as to be coupled to a drain region of the semiconductor layer through a second contact hole formed in the gate insulation film; and (n) forming a pixel electrode so as to be coupled to the drain electrode. The method for forming a film pattern according to the first aspect of the invention is used in at least one of steps (l), (m), and (n). Using the above-described manufacturing methods, an active matrix substrate having high reliability can be manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
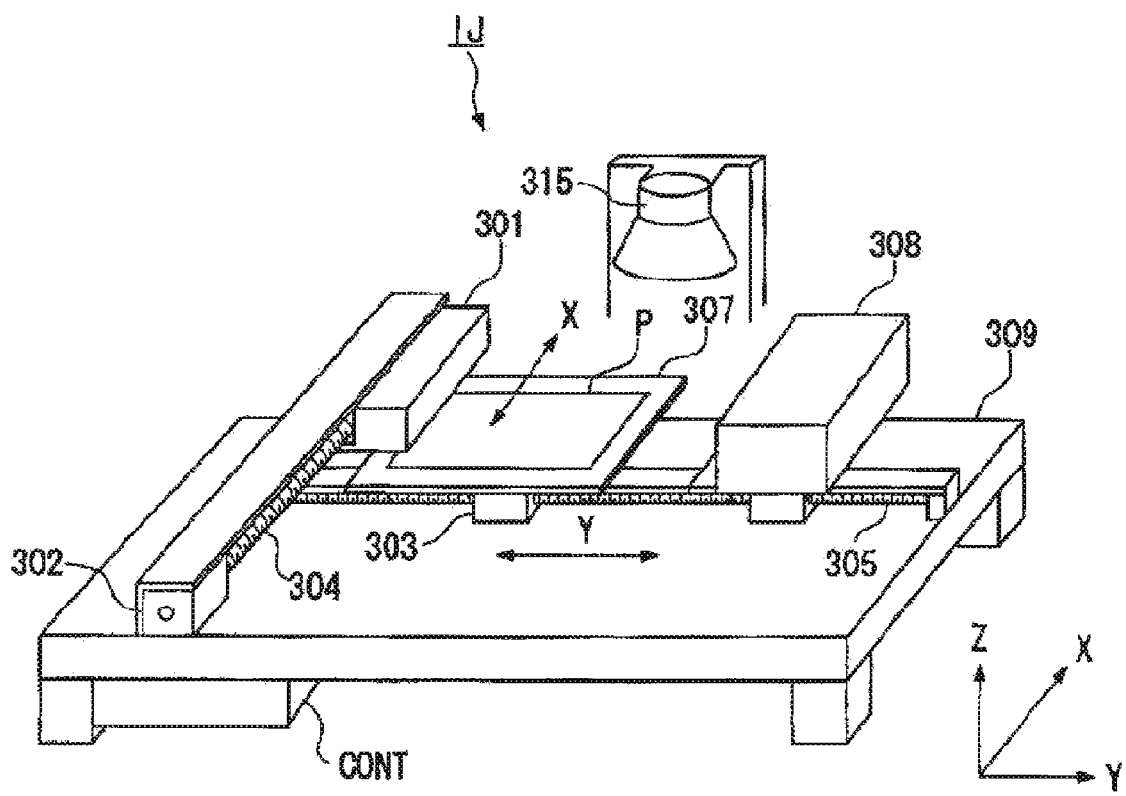
FIG. 1 is a perspective view illustrating a schematic structure of a droplet discharge device according to an embodiment of the invention.

An embodiment of the invention will be described with reference to the accompanying drawings. The embodiment described below is shown by way of example, and not intended to limit the invention. It should be noted that different scales are used for the layers and members in the drawings, so that the layers and members can be recognized.

Droplet Discharge Device

First, a droplet discharge device, which is used to form a film pattern in the embodiment, will be described with reference to FIG. 1.

FIG. 1 is a perspective view illustrating a schematic structure of a droplet discharge device (inkjet device) IJ that disposes a functional liquid on a substrate by a droplet discharge method as an example of devices used for the method for forming a film pattern according to the invention.

The droplet discharge device IJ includes a droplet discharge head 301, an X-axis direction drive axis 304, a Y-axis direction guide axis 305, a controller CONT, a stage 307, a cleaning mechanism 308, a base 309, and a heater 315.

The stage 307, which supports a substrate P to which ink (a liquid material) is provided by the droplet discharge device IJ, includes a fixing mechanism (not shown) for fixing the substrate P to a reference position. In the embodiment, the stage 307 supports a substrate 18, which will be described later.

The droplet discharge head 301 is a multi-nozzle type droplet discharge head including a plurality of discharge nozzles. The longitudinal direction of the head 301 coincides with the X-axis direction. The plurality of nozzles is disposed on a lower surface of the droplet discharge head 301 in the X-axis direction by a constant interval. The ink containing conductive particles (functional liquid) is discharged from the discharge nozzles included in the droplet discharge head 301 to the substrate P supported by the stage 307.

An X-axis direction drive motor 302 is connected to the X-axis direction drive axis 304. The X-axis direction drive motor 302 is a stepping motor, for example, and rotates the X-axis direction drive axis 304 when the controller CONT supplies the motor 302 with a driving signal for X-axis direction. The X-axis direction drive axis 304 rotates so as to move the droplet discharge head 301 in the X-axis direction.

The Y-axis direction guide axis 305 is fixed so as not to move with respect to the base 309. The stage 307 is equipped with a Y-axis direction drive motor 303. The Y-axis direction drive motor 303 is a stepping motor, for example, and moves the stage 7 in the Y-axis direction when the controller CONT supplies the motor 303 with a driving signal for Y-axis direction.

The controller CONT supplies the droplet discharge head 301 with a voltage for controlling a droplet discharge. The controller CONT also supplies the X-axis direction drive motor 302 with a drive pulse signal for controlling the movement of the droplet discharge head 301 in the X-axis direction, as well as the Y-axis direction drive motor 303 with a drive pulse signal for controlling the movement of the stage 307 in the Y-axis direction.

The cleaning mechanism 308 cleans the droplet discharge head 301. The cleaning mechanism 308 is equipped with a drive motor (not shown) for Y-axis direction. By driving the Y-axis direction drive motor, the cleaning mechanism 308 is moved along the Y-axis direction guide axis 305. The controller CONT also controls the movement of the cleaning mechanism 308.

The heater 315, here, which is means to subject the substrate P under heat treatment by a lump annealing, evaporates and dries solvents contained in a liquid material applied on the substrate P. The controller CONT also controls turning on and off of the heater 315.

The droplet discharge device IJ discharges droplets to the substrate P while relatively scanning the droplet discharge head 301 and the stage 307 supporting the substrate P. In the following description, the Y-axis direction is referred to as a scan direction and the X-axis direction perpendicular to the Y-axis direction is referred to as a non-scan direction. Therefore, the discharge nozzles of the droplet discharge head 301 are disposed at a fixed interval in the X-axis direction, which is the non-scan direction. While the droplet discharge head 301 is disposed at right angle to the moving direction of the substrate P in FIG. 1, the angle of the droplet discharge head 301 may be adjusted so as to intersect the moving direction of the substrate P. Accordingly, a pitch between the nozzles can be adjusted by adjusting the angle of the droplet discharge head 301. In addition, the distance between the substrate P and a surface of the nozzle may be arbitrarily adjusted.

Figure 2:
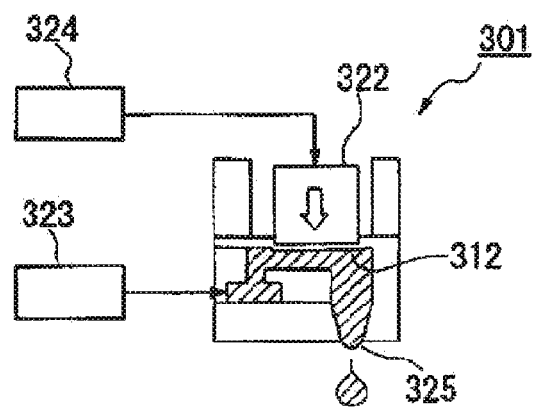
FIG. 2 is a view describing a discharge principle of a liquid by a piezo method.

FIG. 2 is a diagram for explaining a discharge principal of a liquid material by a piezo method.

In FIG. 2, a piezo element 322 is disposed adjacent to a liquid chamber 312 storing a liquid material (ink for wiring pattern or function liquid). To the liquid chamber 312, the liquid material is supplied through a liquid material supply system 323 including a material tank that stores the liquid material.

The piezo element 322 is connected to a driving circuit 324. A voltage is applied to the piezo element 322 via the driving circuit 324 so as to deform the piezo element 322, thereby the liquid chamber 312 is deformed to discharge the liquid material from a nozzle 325. In this case, a strain amount of the piezo element 322 is controlled by changing a value of applied voltage. In addition, a strain velocity of the piezo element 322 is controlled by changing a frequency of the applied voltage.

Here, various techniques, which are known as a principle to discharge a droplet in related art, can be applied in addition to the piezo method in which ink is discharged by using the piezo element, which is a piezoelectric element described above. The techniques include a bubble method in which a liquid material is discharged by bubbles generated by heating the liquid material, and the like. Among these, the piezo method has an advantage of not giving influence to a composition of a liquid material because no heat is applied to the liquid material.

Here, a functional liquid L (refer to FIG. 5) includes a dispersion liquid in which conductive particles, organic silver compounds, or nanoparticles of silver oxide are dispersed in a dispersion medium.

As the conductive fine particles, for example, metal fine particles including any of Au, Ag, Cu, Pd, Mn, Cr, Co, In, Sn, ZnBi, and Ni, their oxides, alloys, intermetallics, organic salts, organometallic compounds, and fine particles of a conductive polymer or a super-conductive material or the like are employed.

These conductive particles may be used with their surfaces coated with an organic matter or the like to improve their dispersibility.

The diameter of the conductive particles is preferably within the range from 1 nm to 0.1 μm. Particles whose diameter is larger than 0.1 μm may cause clogging of the discharge nozzle included in the droplet discharge head, while particles whose diameter is smaller than 1 nm may make the volume ratio of the coated material to the particles become so large that the ratio of the organic matter in the film becomes excessive.

Any dispersion liquid is not limited to be used as long as they can disperse the above-described conductive particles without aggregation. In the embodiment, an aqua based dispersion medium (including water) is used as the dispersion medium of a functional liquid since the functional liquid is disposed as a pattern by utilizing a difference in an affinity of a solution with respect to a multilayerd structure bank.

In this regard, only water is not necessarily used, but a solution medium excluding water can be contained. Examples of the medium can include; alcohols such as methanol, ethanol, propanol, and butanol; ether compounds such as ethylene glycol, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, diethylene glycol mono isobutyl ether, 1,2-dimethoxyethane, bis(2-methoxyethyl)ether, and p-dioxane; and propylene carbonate, gamma-butyrolactone, N-methyl-2-pyrrolidone, dimethylformamide, dimethyl sulfoxide, and cyclohexanone.

The surface tension of the dispersion liquid of the conductive particles is preferably within the range from 0.02 N/m to 0.07 N/m. If the surface tension is below 0.02 N/m when the liquid is discharged by using the droplet discharge method, the wettability of the ink composition with respect to a surface of the discharge nozzle is increased, rendering it likely to cause a flight curve, while if the surface tension exceeds 0.07 N/m, a meniscus shape at the tip of the nozzle is unstable, rendering the control of the discharge amount and discharge timing problematic. To adjust the surface tension, a fluorine-, silicone- or nonionic-based surface tension adjuster, for example, may be added in a small amount to the dispersion liquid within a range not largely lowering a contact angle with respect to a substrate. The nonionic surface tension regulator enhances the wettability of a liquid with respect to a substrate, improves the leveling property of a film, and serves to prevent minute concavities and convexity of the film from being generated. The surface tension adjuster may include, as necessary, organic compounds such as alcohol, ether, ester, and ketone.

The viscosity of the dispersion liquid is preferably within the range from 1 mPa·s to 50 mPa·s. When a liquid material is discharged as a droplet by using a droplet discharge method, ink having a viscosity lower than 1 mPa·s may contaminate the periphery of the nozzle due to ink leakage. Ink having a viscosity higher than 50 mPa·s may possibly cause nozzle clogging, making it difficult to discharge droplets smoothly.

Bank Structure

Next, a bank structure, which controls the position of a functional liquid (ink) on a substrate in the embodiment, will be described with reference to FIGS. 3A and 3B.

Figure 3A:
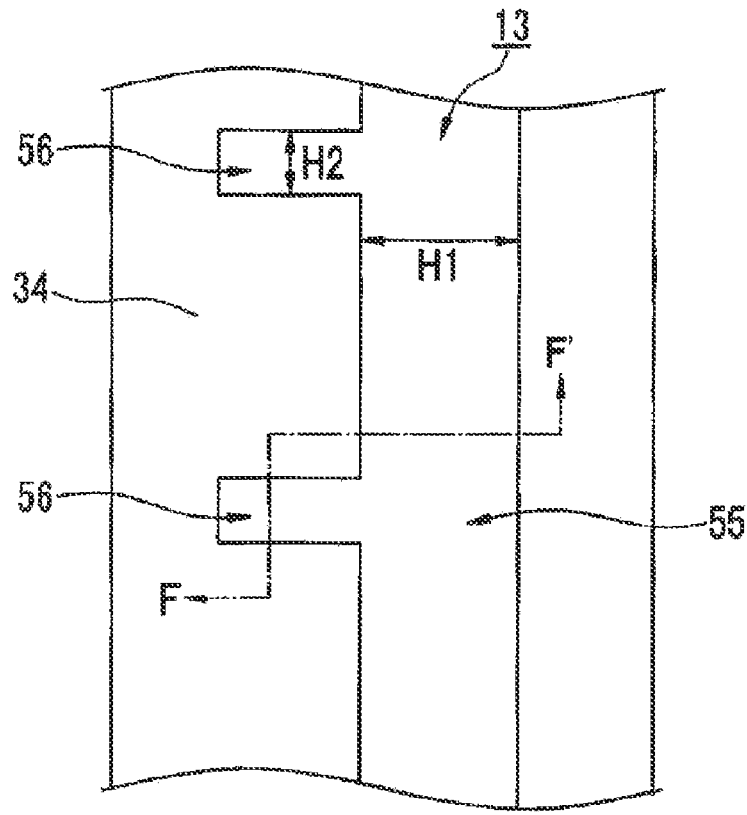
FIG. 3A is a plan view illustrating a bank structure.

FIG. 3A is a plan view illustrating a schematic structure of a bank structure. FIG. 3B is a sectional view illustrating the bank structure taken along the line F-F' in FIG. 3A.

Figure 3B:
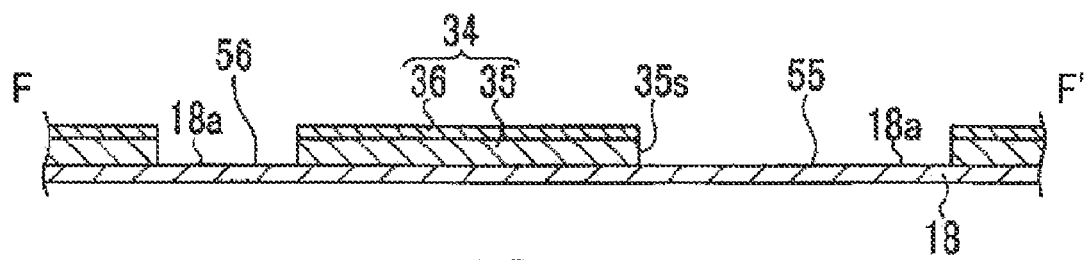
FIG. 3B is a sectional view of FIG. 3A.

As shown in FIGS. 3A and 3B, the bank structure of the embodiment is structured so that a bank 34 is formed on a substrate 18. A region partitioned by the bank 34 is a pattern forming region 13, to which a functional liquid is disposed. The pattern forming region 13 of the embodiment is provided on the substrate 18, to which a gate wiring line and a gate electrode are formed so as to structure a TFT, as described later.

The pattern forming region 13 includes a first pattern forming region 55 and a second pattern forming region 56 connected to the region 55, both of which have a groove shape in section. The region 55 corresponds to a gate wiring line (a film pattern), while the region 56 corresponds to a gate electrode (a film pattern). Here, "correspond" means the following: a functional liquid disposed in the region 55 or the region 56 turns into a gate wiring line or a gate electrode respectively by performing a hardening treatment or the like.

Specifically, as shown in FIG. 3A, the region 55 is formed so as to extend in the Y-axis direction. The region 56 is formed so as to be about perpendicular to the region 55 (in the X-axis direction in FIG. 3A), and be continuously connected to the region 55.

In addition, the width of the region 55 is wider than that of the region 56. In the embodiment, the width of the region 55 is formed so that it is nearly equal to, or slightly larger than a diameter of a flying functional liquid droplet discharged from the droplet discharge device IJ. Employing such bank structure allows a functional liquid discharged on the region 55 to flow into the region 56, which is a fine pattern, by utilizing a capillary phenomenon.

The width of the region 55 is expressed by the length between the edges of the region 55 in the direction perpendicular to the direction in which the region 55 extends (in the Y direction). Likewise, the width of the region 56 is expressed by the length between the edges of the region 56 in the direction perpendicular to the direction in which the region 56 extends (in the X direction). Namely, as shown in FIG. 3A, the width of the region 55 is expressed by a length H1, while the width of the region 56 is expressed by a length H2.

FIG. 3B shows the sectional view (F-F' section) of the bank structure. Specifically, the bank 34 having a multilayered structure is disposed on the substrate 18. In the embodiment, the bank 34 has a two-layer structure of a first bank layer 35 and a second bank layer 36, which are layered in this order from the substrate 18. In addition, the second bank layer 36, which is the upper layer in the bank 34, has higher lyophobicity than the first bank layer 35, while the first bank layer 35, which is the lower layer in the bank 34, has relatively higher lyophilicity than the second bank layer 36. Accordingly, even if a functional liquid is landed on the upper surface of the bank 34, the functional liquid flows into the regions 55 and 56 (mainly into the region 55) since the upper surface has lyophobicity. As a result, the functional liquid adequately flows in the regions 55 and 56.

In the embodiment, the first bank layer 35 preferably has a contact angle of less than 50 degrees with respect to a functional liquid on a sidewall 35s, which facing the regions 55 and 56. In contrast, the second bank layer 36 has a contact angle, which is larger than that of the first bank layer, with respect to a functional liquid. The contact angle with respect to a functional liquid is preferably 50 degrees or more. In addition, the bottom face of the pattern forming region 13 (a surface 18a of the substrate 18) to which a droplet of a functional liquid is provided has a contact angle equal or less than that of the first bank layer 35 with respect to the functional liquid.

In the embodiment, the contact angles of the first bank layer 35 and the bottom face are preferably adjusted so that the sum of the contact angle on the sidewall of the first bank layer 35 and the contact angle on the bottom face of the region 13 becomes small. The resulting structure makes it possible to achieve an effect to further improve wettability of the functional liquid L.

Method for Forming a Film Pattern

Next, a method for forming the bank structure in the embodiment, and a method for forming a gate wiring line as a film pattern on the pattern forming region 13, which is partitioned by the bank structure, will be described.

FIGS. 4A through 4D are sectional views sequentially illustrating forming processes of the bank structure. Namely, FIGS. 4A through 4D are diagrams illustrating forming processes of the pattern forming region 13 including the first pattern forming region 55 and the second pattern forming region 56 based on the sectional view taken along the line F-F' of FIG. 3A. FIGS. 5A through 5C are sectional views describing forming processes of a film pattern (gate wiring line) by disposing a functional liquid to the bank structure formed in the manufacturing process shown in FIGS. 4A through 4D.

Bank Material Coating Process

Figure 4A:
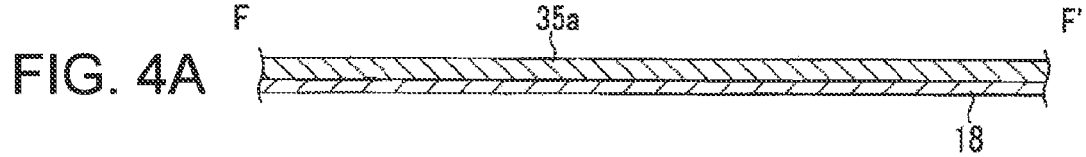
FIGS. 4A through 4D are sectional views illustrating processes to form the bank structure.
Figure 4B:
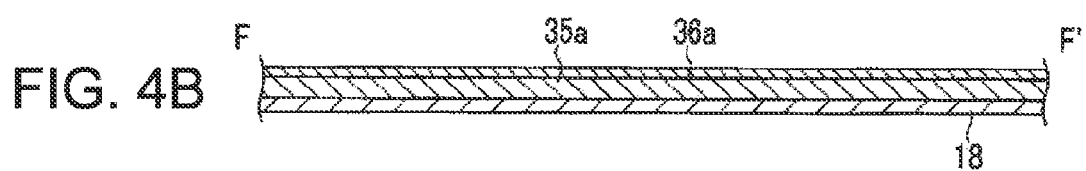
Figure 5A:
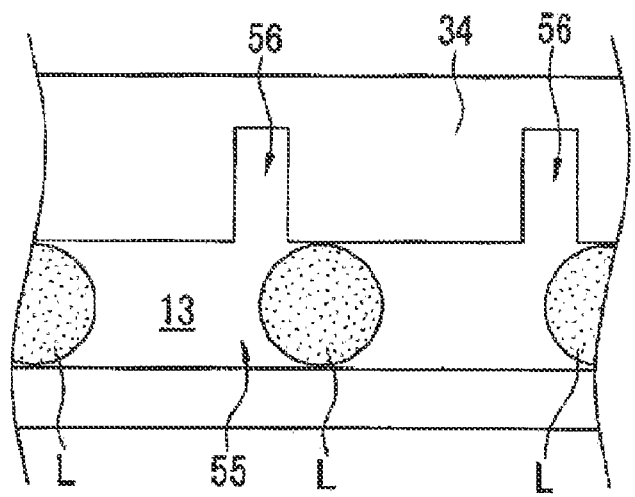
FIGS. 5A through 5C are sectional views describing processes to form a wiring pattern.
Figure 5B:
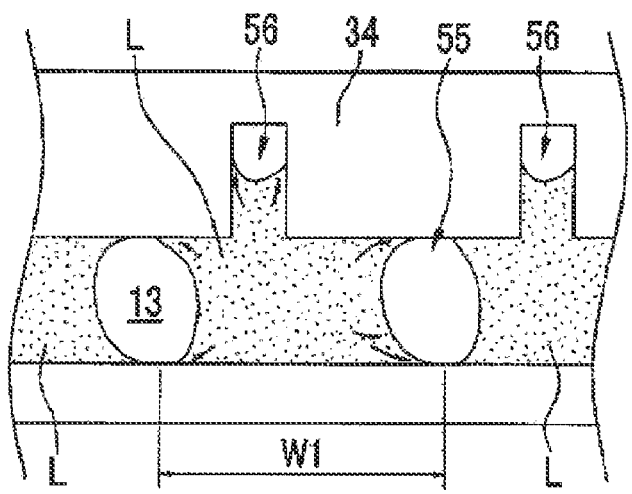
Figure 5C:
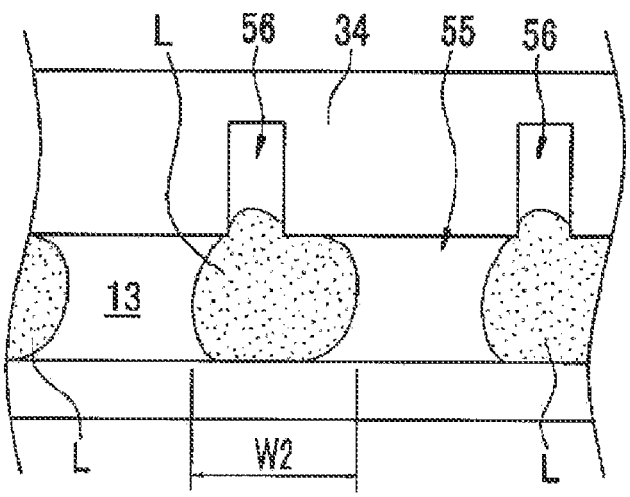

First, a first bank forming material is coated on the entire surface of the substrate 18 by spin coating so as to form a pre-first bank layer 35a (drying condition; at 80 degrees centigrade and for 60 seconds) as shown in FIG. 4A. Then, a second bank forming material is coated by spray coating on the first bank forming material so as to form a pre-second bank layer 36a (drying condition; at 80 degrees centigrade and for 60 seconds) as shown in FIG. 4B. In this case, various methods such as spray coating, roll coating, die coating, and dip coating can be applied as the coating method of the bank forming materials.

As the substrate 18, materials such as glass, quartz glass, a Si wafer, a plastic film, a metal plate can be used. On the surface of the substrate 18, an underlayer such as a semiconductor film, a metal film, a dielectric film and an organic film may be formed.

As the first bank forming material, a material is used that has a contact angle of 50 degrees or less with respect to the functional liquid provided in the pattern forming region 13, and has a relatively higher affinity with respect to the functional liquid. For example, a material (polymer) can be used that has a carbon bond or a siloxane bond as a main chain, and a side chain that includes at least one type chosen from the following list: —H, —OH, —($CH_2CH_2O$)nH, —COOH, —COOK, —COONa, —$CONH_2$, —$SO_3H$, —$SO_3Na$, —$SO_3K$, —$OSO_3H$, —$OSO_3Na$, —$OSO_3K$, —$PO_3H_2$, —$PO_3Na_2$, —$PO_3K_2$, —$NO_2$, —$NH_2$, —$NH_3Cl$(ammonium salt), —$NH_3Br$ (ammonium salt), =HNCl (pyridinium salt), and =NHBr (pyridium salt).

In addition to the materials, as the first bank forming material, a material also can be used that has a carbon bond or a siloxane bond as a main chain, and a side chain a part of which includes an alkyl group, an alkenyl group, or an aryl group.

In contrast, as the second bank forming material, a material is used that has a contact angle larger than that of the first bank layer with respect to a functional liquid, and a relatively low affinity with respect to the functional liquid. For example, a material can be used that has a carbon bond or a siloxane bond as a main chain, and a side chain that includes an alkyl group, an alkenyl group, or an aryl group.

In the embodiment, a case will be described in which an inorganic polymer having a siloxane bond of an inorganic substance as a main chain is used for the first bank forming material and the second bank forming material. Accordingly, drying and firing are performed under a condition of relatively high temperature since the bank is made of an inorganic material. If the bank 34 is made of a different material other than the inorganic material, for example, an organic material, conditions for drying and firing need to be adequately changed depending on the heat resistant temperature of the material.

Exposure Process

Figure 4C:
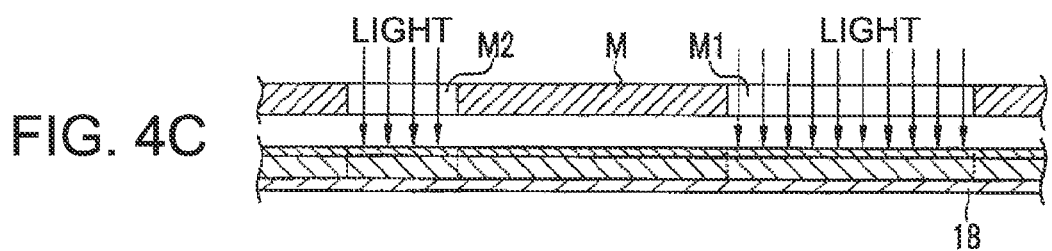

As shown in FIG. 4C, the pre-bank layers 35a and 36a formed on the substrate 18 are irradiated by light from an exposure device (not shown) through a mask M so as to form the regions 55 and 56. In this process, the bank layers 35a and 36a, which are exposed by the irradiation of light, are turned into a state that they can be dissolved and removed in a development process described later. As a result, the bank structure having the pattern forming region 13 is formed.

Development Process

Figure 4D:
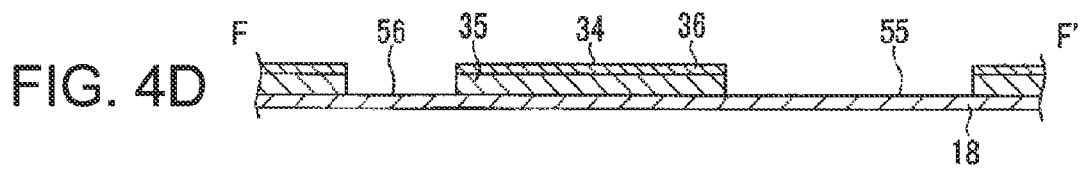

After the exposure process, as shown in FIG. 4D, the bank layers 35a and 36a that has been exposed are developed with, for example, an alkali hydrogen fluoride developer so as to selectively remove the exposed part. Then a firing (at 300 degrees centigrade and for 60 minutes) is carried out. As a result, the bank 34, which defines the pattern forming region 13 including the regions 55 and 56, is formed on the substrate 18 as shown in FIG. 4D.

The bank 34 has a two-layer structure in which the bank layers 35 and 36, each of which has a different affinity with respect to a functional liquid, are layered. The surface of the second bank layer 36 serving as the upper layer has a relatively higher lyophobicity than that of the first bank layer 35 with respect to the functional liquid. In contrast, the inside surface of the first bank layer 35, which faces the pattern forming region 13, has lyophilicity, since the first bank layer 35 is made of a material having lyophilicity, thereby a functional liquid easily spreads.

Functional Liquid Disposition Process

Next, a process to form a gate wiring line (film pattern) will be described. In the process, a functional liquid is discharged and disposed to the pattern forming region 13, which is formed by the bank structure achieved in the above-described processes, by using the droplet discharge device IJ. Here, it is difficult to directly dispose the functional liquid L to the second pattern forming region 56, which is a fine wiring pattern. Therefore, the functional liquid L is disposed to the region 56 by flowing the functional liquid L disposed to the region 55 by utilizing a capillary phenomenon described above.

First, as shown in FIG. 5A, the functional liquid L serving as a wiring pattern forming material is discharged to the first pattern forming region 55 by the droplet discharge device IJ. The functional liquid L disposed to the region 55 by the droplet discharge device IJ wets and spreads in the region 55 as shown in FIG. 5B. Even if the functional liquid L is disposed on the upper surface of the bank 34, the functional liquid L is repelled and flows into the region 55 since the upper surface has lyophobicity.

Figure 6A:
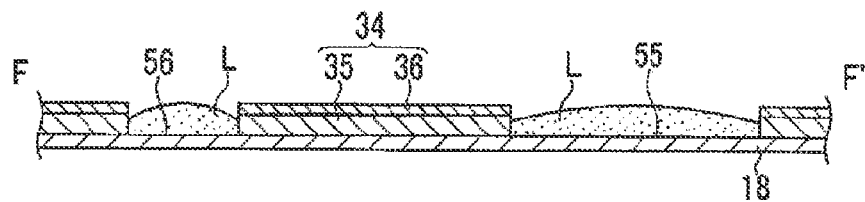
FIGS. 6A through 6C are sectional views describing processes to form a wiring pattern.
Figure 6B:
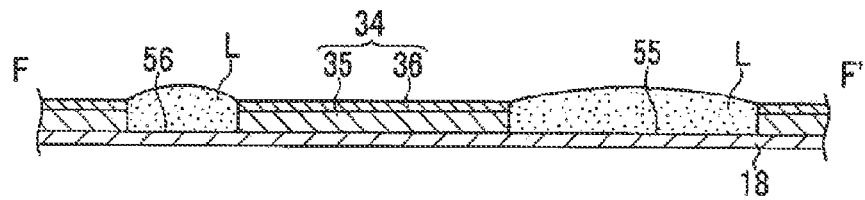
Figure 6C:
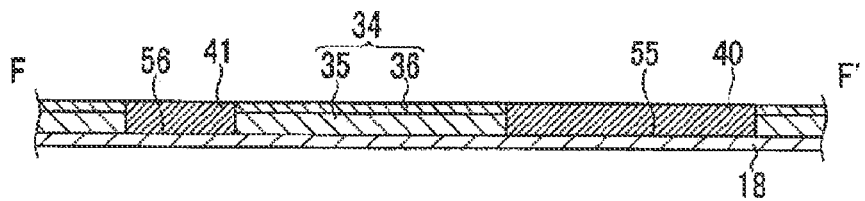

In contrast, the functional liquid L, which is discharged and disposed, adequately flows in the entire area of the pattern forming region 13 since the inside surface of the bank 34 (inside surface of the first bank layer 35) shows a higher lyophilicity than its upper surface. As shown in FIGS. 6A through 6C, the functional liquid L uniformly spreads in the regions 55 and 56.

In the invention, the contact angle with respect to a functional liquid on the sidewall of the first bank layer 35 is 50 degrees or less, as described above. Thus, as shown in FIG. 5B, the functional liquid L wets and spreads along the sidewall of the first bank layer 35, showing a markedly favorable wettability. FIG. 5C shows how the functional liquid L spreads when the contact angle on the sidewall of the first bank layer 35 is 50 degrees or more as a comparative case. The contact angle is 8 degrees on the sidewall of the first bank layer 35 according to the embodiment shown in FIG. 5B. The contact angle is 51 degrees on the sidewall of the first bank layer 35 of the case shown in FIG. 5C. The surface characteristic of a part excluding the first bank layer 35 is the same in FIGS. 5A and 5B. Likewise, the functional liquid L is also the same.

The comparison between FIGS. 5A and 5B makes clear the following. In the embodiment shown in FIG. 5B, in which the contact angle on the sidewall of the first bank layer 35 is 50 degrees or less, the functional liquid L extends along the sidewall of the first bank layer 35 and wets and spreads in a wide area. In contrast, in the case shown in FIG. 5C, in which the contact angle on the sidewall of the first bank layer 35 is 50 degrees or more, the functional liquid L wets and spreads in the extending direction of the region 55 with a convex shape in a plan view. As a result, the functional liquid L spreads in an area smaller than that in FIG. 5B. Particularly, the difference is more apparent in the region 56, in which a functional liquid spreads by utilizing a capillary phenomenon.

In this regard, the inventor confirmed the following. The lengths W1, and W2 were about 220 μm and about 80 μm respectively, at the time when the same time period was passed after discharging the functional liquid L. Namely, the functional liquid L in the embodiment shown in FIG. 5B spread about 2.7 times easier than in the case shown in FIG. 5C.

While the case is described above in which the contact angle is 8 degrees on the sidewall of the first bank layer 35 structured as shown in FIG. 5B, the inventor also confirmed the following. In a case where the contact angle was 8 degrees to 44 degrees, the top shape of the function liquid L shown in FIG. 5B was a concave shape along the sidewall of the bank in a plan view. In contrast, a case where the contact angle was 50 degrees or more was confirmed with a number of samples. As the result, the functional liquid L spread with the top shape of a convex in a plan view. Thus, the wettabilty was inferior to the case where the contact angle was less than 50 degrees.

Intermediate Drying Process

A drying process is carried out, if necessary, after disposing the functional liquid L to the regions 55 and 56. This process removes a dispersion medium of the functional liquid L, and assures the film thickness of a pattern. Specifically, the functional liquid L disposed to the region 55 turns into a first wiring pattern 40, while the functional liquid L disposed to the region 56 turns into a second wiring pattern 41.

The drying process can be carried out by various methods such as a typical hot plate, an electric furnace, and a lamp annealing to heat the substrate 18. Examples of light sources for the lamp annealing, which are not particularly limited, can include: infrared lamps, xenon lamps, YAG lasers, argon lasers, carbon dioxide lasers, and excimer lasers such as XeF, XeCl, XeBr, KrF, KrCl, ArF, and ArCl. The light sources covering the range from 10 W to 5000 W are typically used, but in the embodiment, the range from 100 W to 1000 W is adequate. In addition, the functional liquid disposition process may be repeatedly carried out after the intermediate drying process, if necessary, in order to achieve a desired film thickness.

Firing Process

After disposing the functional liquid L, if the functional liquid L includes a conductive material such as an organic silver compound, heat treatment is required to remove an organic matters of the organic silver compound, thereby silver particles remain. Therefore, a substrate on which the functional liquid L has been disposed is preferably subjected to a heat treatment or a light treatment. The heat treatment and the light treatment are usually carried out in an atmosphere, and can also be carried out in an inert gas atmosphere such as hydrogen, nitrogen, argon, and helium, if necessary. The process temperature of the heat treatment and the light treatment is appropriately decided taking the following items into consideration: the boiling point (steam pressure) of a solvent, the nature or pressure of an environmental gas, dispersibility of fine particles or organic silver compounds or thermal behavior of oxidation on them, presence or absence or an amount of a coating material, a heat resistance temperature of a base material, and so on. For example, eliminating organic matters in an organic silver compound requires firing at about 200 degrees centigrade. When using a plastic substrate, for example, the firing is preferably carried out in a temperature range from room temperature to 100 degrees centigrade.

Through these processes, the conductive material (organic silver compound) of the functional liquid L remains and turns into a conductive film. As a result, a continuous conductive film having little difference in a film thickness, i.e., a first wiring pattern 40 functioning as a gate wiring line, and a second wiring pattern 41 functioning as a gate electrode can be achieved as shown in FIG. 6C.

Since the difference in a film thickness between the gate wiring line and the gate electrode can be nearly eliminated as described above, transistor characteristics can be stabilized.

In the first embodiment, a film pattern is formed the following manner: the functional liquid L is discharged and disposed to the pattern forming region 13 after firing the bank 34; the functional liquid L is dried; and the film pattern is fired. However, the bank 34 and the film pattern may be fired at once. Namely, the functional liquid L may be discharged and disposed after forming the bank 34 without firing the bank 34, and then the bank 34 and the functional liquid L after drying may be fired at once. In this case, the firing process that takes time to heat up to a high temperature is omitted, thereby manufacturing efficiency can be increased.

Second Embodiment

In the first embodiment, a case is described in which a film pattern made of single material is formed. However, the method for forming a film pattern according to the invention is also favorable compared to related art when a film pattern is formed as a multilayerd structure of a plurality of materials. For example, a two-layer structure may be employed in a gate wiring line included in a pixel of an electro-optical device. The two-layer structure is composed of a base layer formed by using one or two or more metal materials chosen from Ag, Cu, Al, or the like, and a covering layer formed by using one or two or more metal materials chosen from Ni, Ti, W, Mn or the like. The two-layer structure prevents Ag, Cu, Al, or the like included in the base layer from diffusing into a gate insulation film with the covering layer, thereby a TFT is prevented from a malfunction, a low electron mobility, or the like. In addition, an adhesive layer (e.g. Mn is used) may be provided between the base layer and a substrate to improve adhesiveness therebetween.

If the method for forming a film pattern according to the invention is applied to form a film pattern having the above-described structure, each of the first bank layer 35 and the second bank layer 36 has a contact angle on each surface. Each contact angle is controlled by each material forming each bank layer. Accordingly, each contact angle on the surfaces of the first bank layer 35 and the second bank layer 36 do not change, even though the functional liquid L is discharged and disposed to the pattern forming region 13, and then heated so as to be dried and solidified. Therefore, in the above-described case, the covering layer made of Ni or the like can be subsequently formed after forming the base layer made of Ag or the like without performing a surface treatment such as a plasma treatment to the bank 34 as a required process. As a result, a functional liquid to form the covering layer can be adequately kept in a pattern forming region, and can rapidly wet and spread in the region uniformly.

When a film pattern having a multilayerd structure of the embodiment is formed, a lower layer (the base layer in the above-described case) is formed so that the film thickness of the layer after drying is thinner than that of the first bank. In other words, the lower layer is formed so that the film thickness of the first bank layer 35 is thicker than that of the lower layer. The reason is that if the lower layer covers the sidewall of the first bank layer 35, wettability of a functional liquid for forming an upper layer (the covering layer in the above-described case) is lowered when the functional liquid is discharged and disposed. Note that the bank 34 and a film pattern can also be fired at once when a film pattern having a multi-layered structure is formed.

Third Embodiment

Device

Next, a device will be described that has a film pattern formed by the method for forming a film pattern according to the invention. In a third embodiment, a pixel (device) having a gate wiring line, and a method for forming the pixel will be described with reference to FIGS. 7 and 8.

In the embodiment, a pixel, which includes a gate electrode, a source electrode, a drain electrode, and the like of a TFT 30 of a bottom gate type, is formed by using the above-described methods for forming a bank structure and a film pattern. In the following description, the description of the same process in the film pattern forming processes shown in FIGS. 5 and 6 will be omitted. The structural element the same as that in the first embodiment is given the same numeral.

Structure of a Pixel

First, the structure of a pixel (device) having a film pattern formed by the method for forming a film pattern will be described.

Figure 7:
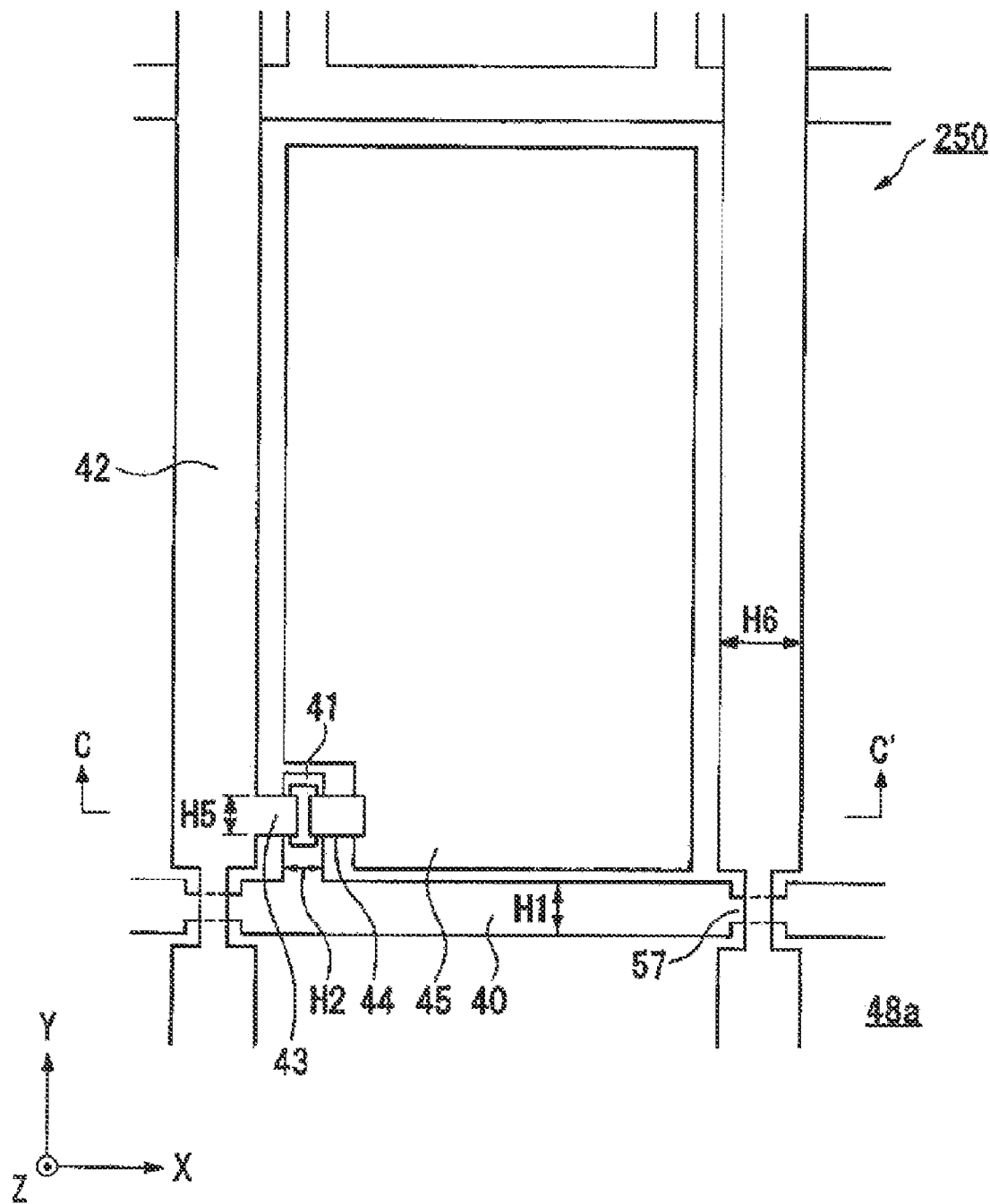
FIG. 7 is a plan view illustrating a pixel serving as a display area.

FIG. 7 shows a pixel structure 250 of the embodiment.

As shown in FIG. 7, the pixel structure 250 is provided, on a substrate, with a gate wiring line 40 (the first wiring pattern), a gate electrode 41 (the second wiring pattern) formed so as to be extended from the gate wiring line 40, a source wiring line 42, a source electrode 43 formed so as to be extended from the source wiring line 42, a drain electrode 44, and a pixel electrode 45 electrically connected to the drain electrode 44. The gate wiring line 40 is formed so as to extend in the X-axis direction, while the source wiring line 42, which intersects the gate wiring line 40, is formed so as to extend in the Y-axis direction. In the vicinity of the intersection of the gate wiring line 40 and the source wiring line 42, a TFT, which is a switching element, is formed. By turning on the TFT, a drive current is supplied to the pixel electrode 45 connected to the TFT.

As shown in FIG. 7, the width H2 of the gate electrode 41 is formed so as to be narrower than the width H1 of the gate wiring line 40. For example, the width H2 of the gate electrode 41 is 10 μm, while the width H1 of the gate wiring line 40 is 20 μm. The gate wiring line 40 and the gate electrode 41 are formed by using the method of the first embodiment.

A width H5 of the source electrode 43 is formed so as to be narrower than a width H6 of the source wiring line 42. For example, the width H5 of the source electrode 43 is 10 μm, while the width H6 of the source wiring line 42 is 20 μm. In the embodiment, a functional liquid flows into the source electrode 43, which is a fine pattern, by a capillary phenomenon by applying the method for forming a film pattern.

In addition, as shown in FIG. 7, a narrowed width part 57, which has a wiring line width narrower than that of other region, is provided at a part of the gate wiring line 40. Likewise, a similar narrowed width part is also provided to a part, which intersects with the gate wiring line 40, of the source wiring line 42. As a result, capacitance is not stored at the intersection since each wiring width of the gate wiring line 40 and the source wiring line 42 is formed narrow at their intersection.

A Method for Forming a Pixel

FIGS. 8A through 8E are sectional views, which are taken along the line C-C' shown in FIG. 7, illustrating forming processes of the pixel structure 250.

Figure 8A:
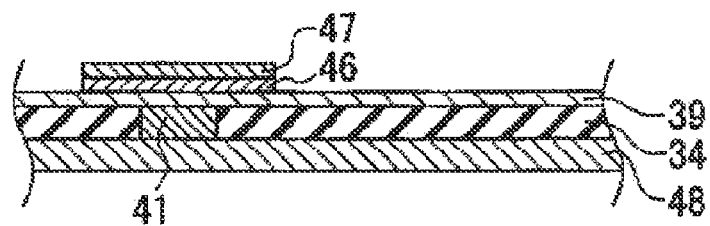
FIGS. 8A through 8E are sectional views describing processes to form a pixel.

As shown in FIG. 8A, a gate insulation film 39 is deposited on the surface of the bank 34, which includes the gate electrode 41 formed by the above-described method, by a plasma CVD or the like. Here, the gate insulation film 39 is made of silicon nitride. Then, an active layer is formed on the gate insulation layer 39. Subsequently, a predetermined shape is patterned by a photolithographic treatment and etching, thereby an amorphous silicon film 46 is formed as shown in FIG. 8A.

Then, on the amorphous silicon film 46, a contact layer 47 is deposited. Subsequently, a predetermined shape is patterned by a photolithographic treatment and etching as shown in FIG. 8A. The contact layer 47 is formed as an n+ silicon film by changing raw material gas or plasma conditions.

Figure 8B:
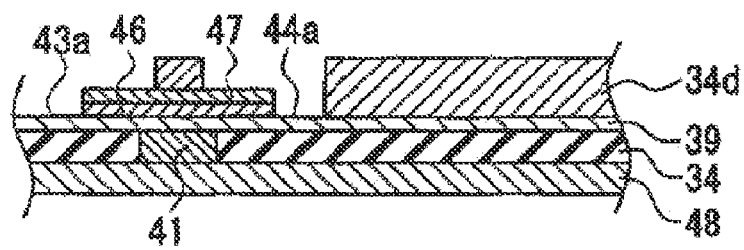

Then, as shown in FIG. 8B, a bank material is coated on the entire surface including the contact layer 47 by a spin coating method or the like. Here, as the material included in the bank material, polymer material such as an acrylate resin, a polyimide resin, an olefin resin, and a melamine resin is preferably used since the material needs to have optical transparency and lyophobicity after a bank is formed. More preferably, polysilazane having an inorganic backbone is used in terms of its heat resistance in a firing process and optical transparency. Then, $CF_4$ plasma treatment or the like (plasma treatment using gas containing a fluorine component) is carried out to give lyophobicity to the bank material. Alternatively, a raw material for forming a bank is preferably filled with a lyophobic component (a fluorine group or the like) instead of such treatment. In this case, $CF_4$ plasma treatment or the like can be omitted.

Next, a bank 34d for source-drain electrode, whose width is 1/20 to 1/10 of one pixel pitch, is formed. Specifically, a source electrode forming region 43a is formed by a photolithographic treatment to a position, which corresponds to the source electrode 43, of the bank forming material coated on the upper surface of the gate insulation film 39. Likewise, a drain electrode forming region 44a is formed to a position corresponding to the drain electrode 44.

When a functional liquid for forming the source and drain electrodes contains an aqua based solvent (dispersion medium), a bank similar to the bank 34, which has a multilayered structure of the first bank layer 35 and the second bank layer 36 as described in the first embodiment, can be formed and used as the bank 34d for source-drain electrode. Namely, the method for forming a film pattern according to the invention can be applied to the process to form the source and drain electrodes.

Accordingly, the multilayered structure renders a functional liquid to wet and spread adequately, thereby a source electrode and drain electrode can be uniformly and homogeneously formed. The multilayered structure includes the first bank layer 35 having a contact angle of 50 degrees or less with respect to the functional liquid, and the second bank layer 36 having a contact angle larger than that of the first bank layer 35. Especially, when a multilayered structure composed of a plurality of materials such as that described in the second embodiment is employed to a source electrode and a drain electrode, manufacturing efficiency can be increased since performing a lyophobic treatment for a bank is not required at every time when each of a plurality of film patterns is layered.

Figure 8C:
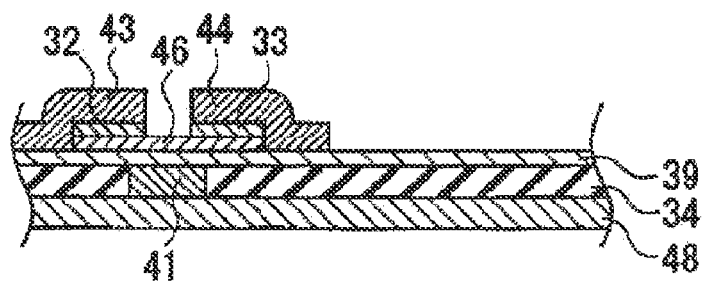

Then, the functional liquid L is disposed to the source electrode forming region 43a and the drain electrode forming region 44a that are formed in the bank 34d so as to form the source electrode 43 and the drain electrode 44. Specifically, first, the functional liquid L is disposed to a region for forming a source wiring line by the droplet discharge device IJ. This process is not shown. The width H5 of the source electrode forming region 43a is formed so as to be narrower than the width H6 of the region for forming a source wiring line. Therefore, the functional liquid L disposed to the region for forming a source wiring line is transiently blocked by the narrowed width part provided to the source wiring line, flowing into the source electrode forming region 43a by a capillary phenomenon. As a result, as shown in FIG. 8C, the source electrode 43 is formed. Likewise, the drain electrode 44 is formed by discharging the functional liquid to the drain electrode forming region 44a. This process is not shown.

As shown FIG. 8C, the bank 34d is removed after forming the source electrode 43 and the drain electrode 44. Then, the $n^+$ silicon film, which forms the contact layer 47, formed between the source electrode 43 and the drain electrode 44 is etched by using each of the source electrode 43 and the drain electrode 44 that remain on the contact layer 47 as a mask. In the etching process, the $n^+$ silicon film of the contact layer 47 formed between the source electrode 43 and the drain electrode 44 is removed. As a result, a part of the amorphous silicon film 46, which is formed under the $n^+$ silicon film, is exposed. Consequently, the source region 32 made of $n^+$ silicon is formed under the source electrode 43, while the drain region 33 made of $n^+$ silicon is formed under the drain electrode 44. Under the source region 32 and the drain region 33, a channel region made of the amorphous silicon film 46 is formed.

Through the above-described processes, the TFT 30 of a bottom gate type is achieved.

Figure 8D:
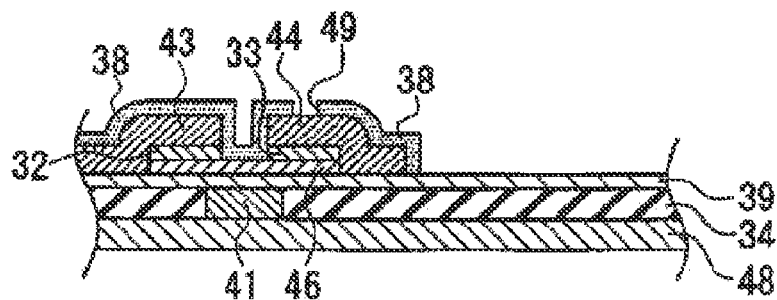

As shown in FIG. 8D, a passivation film 38 (protective film) is deposited on the source electrode 43, the drain electrode 44, the source region 32, the drain region 33, and the amorphous silicon film 46 by vapor deposition, sputtering or the like. Subsequently, the passivation film 38 on the gate insulation film 39 on which the pixel electrode 45 is formed is removed by a photolithographic treatment and etching. At the same time, a contact hole 49 is formed to the passivation film 38 deposited on the drain electrode 44 in order to electrically connect the pixel electrode 45 to the source electrode 43.

Figure 8E:
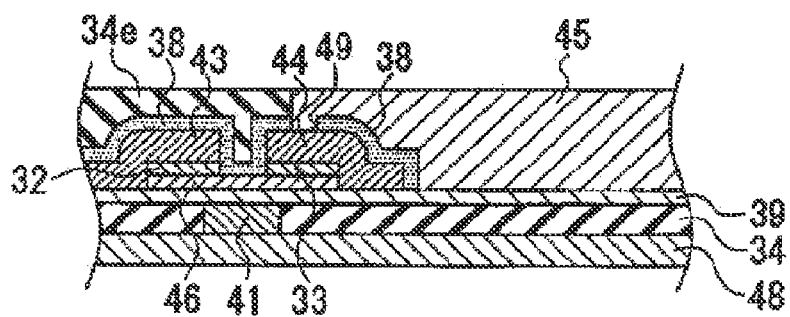

Then, as shown in FIG. 8E, a bank material is coated on the entire surface including the gate insulation film 39 on which the pixel electrode 45 is formed. Here, the bank material includes a material such as an acrylate resin, a polyimide resin, or polysilazane as described above. Subsequently, a lyophobic treatment is carried out on the upper surface of the bank material (a pixel electrode bank 34e) by plasma treatment or the like. Then, the pixel electrode bank 34e that partitions a region for forming a pixel electrode, in which the pixel electrode 45 is formed, by a photolithographic treatment.

Note that a bank having a multilayered structure used in the method for forming a film pattern according to the invention may be formed as the pixel electrode bank 34e.

Next, the pixel electrode 45 made of indium tin oxide (ITO) is formed in the region for forming a pixel electrode, which is partitioned by the pixel electrode bank 34e, by an inkjet method, a vapor deposition method, or the like. In addition, the contact hole 49 is filled with the pixel electrode 45 so as to assure an electrical connection between the pixel electrode 45 and the drain electrode 44. In the embodiment, a lyophobic treatment is carried out on the upper surface of the pixel electrode bank 34e, and a lyophilic treatment is carried out to the region for forming a pixel electrode. Accordingly, the pixel electrode 45 can be formed without running over the region for forming a pixel electrode.

Through the above-described processes, the pixel of the embodiment shown in FIG. 7 can be formed.

Fourth Embodiment

Electro-optical Device

Next, a liquid crystal display will be described. The liquid crystal display is an example of an electro-optical device according to the invention. The electro-optical device is provided with a pixel (device) formed by the above-described method for forming a film pattern with a bank structure.

Figure 9:
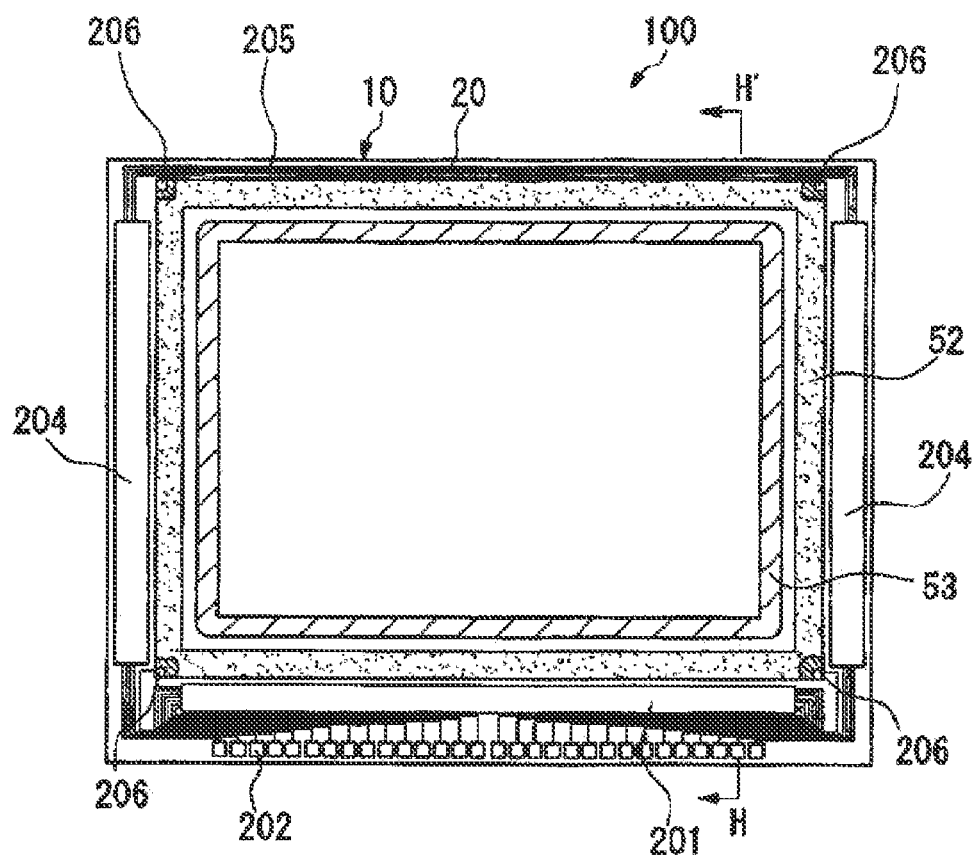
FIG. 9 is a plan view illustrating a liquid crystal display viewed from an opposing substrate.
Figure 10:
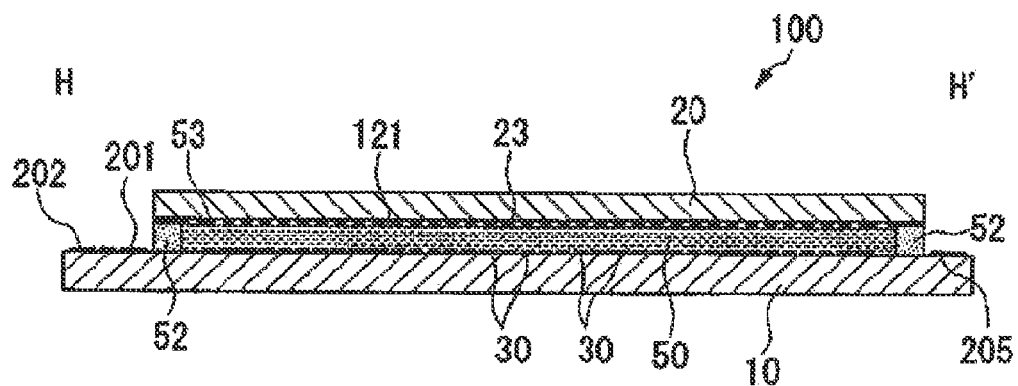
FIG. 10 is a sectional view of the liquid crystal display taken along the line H-H' of FIG. 9.
Figure 11:
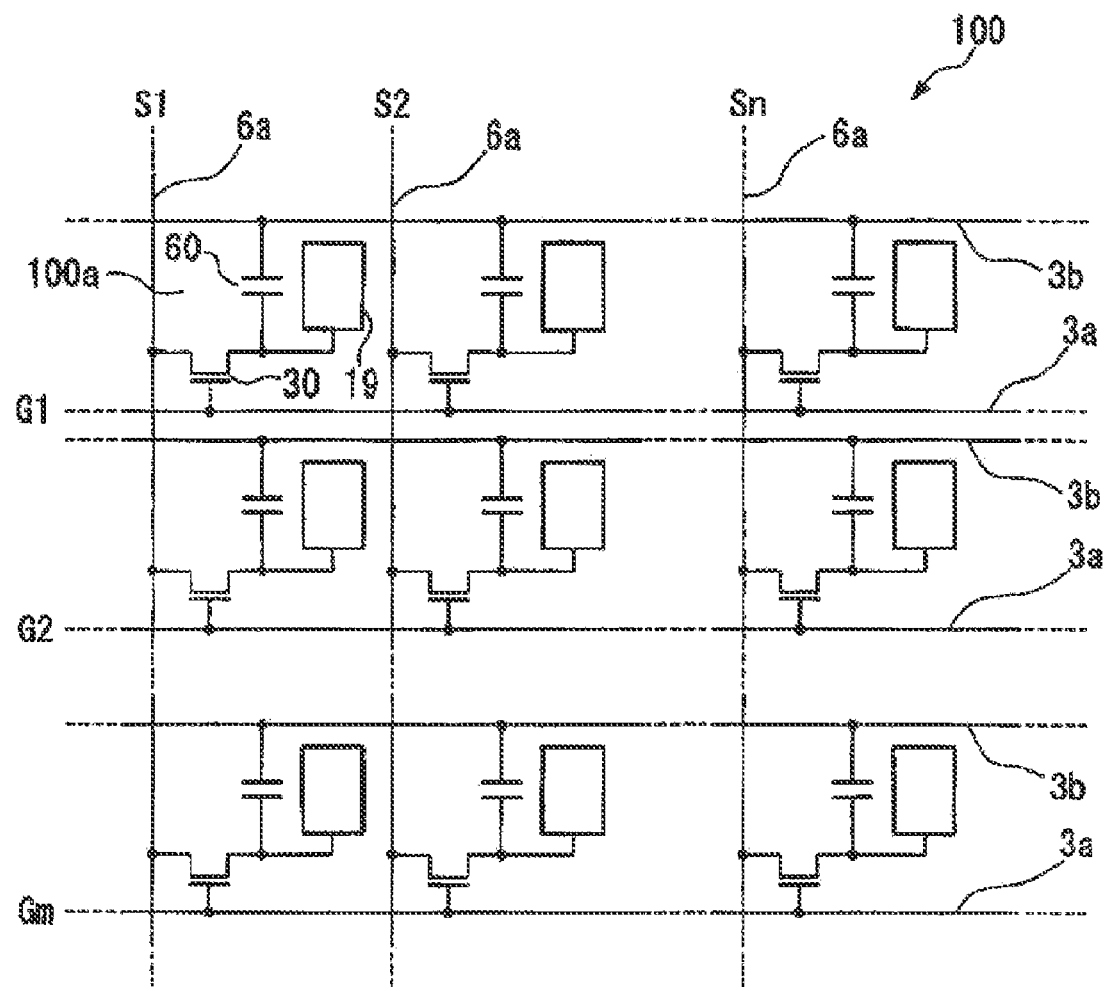
FIG. 11 is an equivalent circuit view of the liquid crystal display.

FIG. 9 is a plan view of a liquid crystal display according to a fourth embodiment of the invention. The plan view illustrates each element by viewing from an opposing substrate side. FIG. 10 is a sectional view taken along the line H-H' of FIG. 9. FIG. 11 is an equivalent circuit diagram illustrating a plurality of pixels, which include various elements, wiring lines, or the like, formed in a matrix in an image display area of a liquid crystal display. Note that scales of layers and members in the drawings referred to hereinafter are adequately changed so that they are visible.

Referring to FIGS. 9 and 10, in a liquid crystal display (electro-optical device) 100 according to the embodiment, a TFT array substrate 10 and an opposing substrate 20 are bonded as a pair with a photocuring sealant 52 interposed therebetween. In an area defined by the sealant 52, a liquid crystal 50 is sealed and retained.

In a region inside the area where the sealant 52 is provided, a peripheral light-blocking film 53 made of a light blocking material is provided. In an area outside the sealant 52, a data line driving circuit 201 and a mount terminal 202 are provided along one side of the TFT array substrate 10. Provided along two sides adjacent to the one side are scanning line driving circuits 204. Provided along another side of the TFT array substrate 10 are a plurality of wiring lines 205 to couple the scanning line driving circuits 204 provided to the both sides of the image display area. At one or more of the corners of the opposing substrate 20, an inter-substrate conductive material 206 is disposed to provide electrical conductivity between the TFT array substrate 10 and the opposing substrate 20.

In this regard, instead of providing the data line driving circuit 201 and the scanning line driving circuits 204 on the TFT array substrate 10, a tape automated bonding (TAB) substrate on which a driving LSI is mounted and the TFT array substrate 10 may be electrically and mechanically connected with an anisotropic conductive film, which is provided between a group of terminals provided around the TAB substrate and the TFT array substrate 10. Note that a retardation film, a polarizer, etc., included in the liquid crystal display 100 are disposed in a predetermined direction (not shown) depending on the type of the liquid crystal 50, i.e., operation modes including twisted nematic (TN), a C-TN method, a VA method, and an IPS method, and normally white mode or normally black mode.

If the liquid crystal display 100 is provided as a color display, red (R), green (G) and blue (B) color filters, for example, and their protective films are provided in an area in the opposing substrate 20 opposing to each pixel electrode in the TFT array substrate 10 that will be described below.

In the image display area of the liquid crystal display 10 of having the above-described structure, as shown in FIG. 11, a plurality of pixels 100a are arranged in a matrix. Each of the pixels 100a is provided with the TFT (switching element) 30 for switching a pixel. To the source of the TFT 30, each of data lines 6a that supplies pixel signals S1 through Sn is electrically coupled. The pixel signals S1 through Sn written in each data line 6a may be supplied line-sequentially in this order or in groups for a plurality of adjacent data lines each corresponding to the data line 6a. To the gate of the TFT 30, each of scanning lines 3a is electrically coupled. To respective scanning lines 3a, scanning signals G1 through Gm are applied pulsatively and line-sequentially in this order at a predetermined timing.

A pixel electrode 19 is electrically coupled to the drain of the TFT 30. The TFT 30, which is a switching element, is turned on for a certain period, and thereby the pixel signals S1 through Sn supplied from the data lines 6a are written in each pixel at a predetermined timing. Each of the pixel signals S1 through Sn, which has a predetermined level and written in the liquid crystal via the pixel electrode 19, is retained between an opposing electrode 121 of the opposing electrode 20 shown in FIG. 10 and the pixel electrode 19 for a certain period. In order to prevent a leak of the retained pixel signals S1 through Sn, a storage capacitor 60 is provided in parallel with a liquid crystal capacitance formed between the pixel electrode 19 and the opposing electrode 121. For example, the voltage of the pixel electrode 19 is retained by the storage capacitor 60 for a period of time three orders of magnitude longer than the time for which a source electrode is applied. Consequently, an electron retention property increases, thereby the liquid crystal display 100 with a high contrast ratio can be provided.

Figure 12:
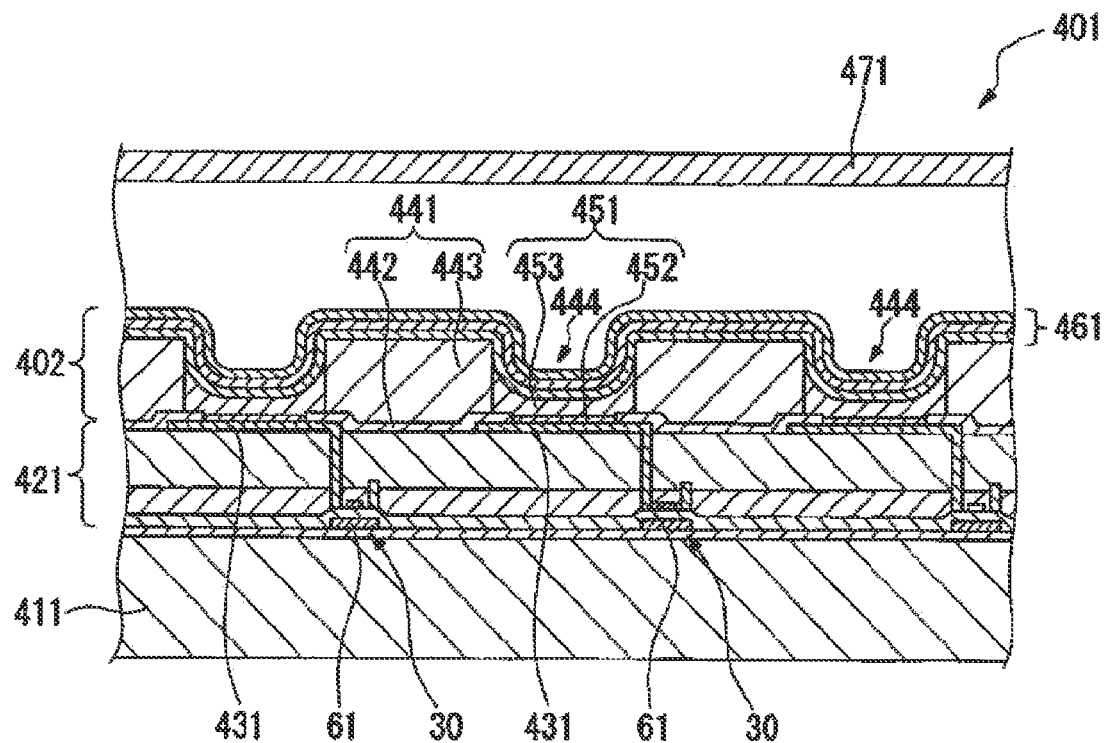
FIG. 12 is a partially enlarged sectional view of an organic EL device.

FIG. 12 is a sectional view illustrating an organic EL device provided with a pixel formed by the above-described method for forming a film pattern with a bank structure. The schematic structure of the organic EL device will be described below with reference to FIG. 12.

In FIG. 12, an organic EL device 401 is provided with an organic EL element 402 and a wiring line of a flexible substrate (not shown) and a driving IC (not shown) that are connected to the organic EL element 402. The organic EL element 402 includes a substrate 411, a circuit element part 421, a pixel electrode 431, a bank part 441, a light emitting element 451, a cathode 461 (opposing electrode), and a sealing substrate 471. In the circuit element part 421, the TFT 30 serving as an active element is formed on the substrate 411. Arrayed on the circuit element part 421 is a plurality of pixel electrodes 431. The gate wiring line 61, which is includes in the TFT 30, is formed by the method for forming a wiring pattern described in the first embodiment.

Between the respective pixel electrodes 431, the bank parts 441 are formed as a grid like. The light emitting element 451 is formed to a concave opening 444 resultingly formed by the bank part 441. The light emitting element 451 is provided with an element emitting red light, an element emitting green light, and an element emitting blue light so that the organic EL device 401 provides a full-color display. The cathode 461 is formed on the entire upper surface of the bank parts 441 and the light emitting elements 451, and on the cathode 461, the sealing substrate 471 is placed.

A manufacturing process of the organic EL device 401 having an organic EL element includes a bank part forming process to form the bank part 441, a plasma treatment process to adequately form the light emitting element 451, a light emitting element forming process to form the light emitting elements 451, an opposing electrode forming process to form the cathode 461, and a sealing process to place the sealing substrate 471 on the cathode 461 and seal it.

In the light emitting element forming process, the light emitting element 451 is formed by forming a hole injection layer 452 and a light emitting layer 453 on the pixel electrode 431, which is located under the concave opening 444. The process also includes a hole injection layer forming process and a light emitting layer forming process. The hole injection layer forming process includes a first discharge process and a first drying process. In the first discharge process, a liquid material to form the hole injection layer 452 is discharged on to each pixel electrode 431. In the first drying process, the discharged liquid material is dried so as to form the hole injection layer 452. The light emitting layer forming process includes a second discharge process and a second drying process. In the second discharge process, a liquid material to form the light emitting layer 453 is discharged on to the hole injection layer 452. In the second drying process, the discharged liquid material is dried so as to form the light emitting layer 453. As for the light emitting layer 453, three types of layers are formed by materials, each corresponding to respective three colors of red, green, and blue as described above. Therefore, the second discharge process includes three processes, each discharging respective three types of materials.

In the light emitting element forming process, the droplet discharge device IJ can be used for the first discharging process in the hole injection layer forming process and the second discharging process in the light emitting layer forming process. As a result, a uniform film pattern can be achieved even if a fine film pattern is included.

Since the electro-optical device according to the invention is provided with a device having favorable electrical characteristics, an electro-optical device having improved quality and performance can be achieved.

The electro-optical device according to the invention is also applicable to plasma display panels (PDPs) and surface-conduction electron emission elements that use a phenomenon of emitting electrons by passing an electrical current through in parallel with the surface of a thin film formed on a substrate with a small area.

Fifth Embodiment

Electronic Apparatus

Next, specific examples of an electronic apparatus of the invention will be described as a fifth embodiment of the invention.

Figure 13:
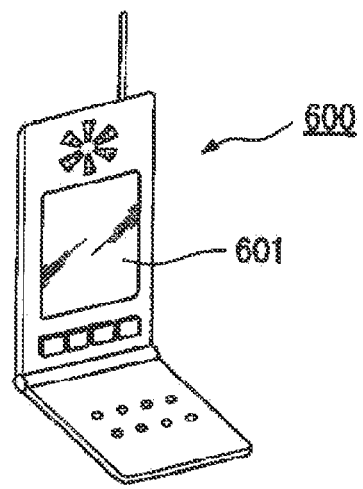
FIG. 13 shows an example of an electronic apparatus according to another embodiment of the invention.

FIG. 13 is a perspective view illustrating an example of a cellular phone. In FIG. 13, a cellular phone body 600 is provided with a liquid crystal display 601 including a liquid crystal display of the fourth embodiment.

The electronic apparatus shown in FIG. 13 provides high quality and performance since it is provided with a liquid crystal display formed by the method for forming a pattern with a bank structure described in the first embodiment.

The electronic apparatus of the fifth embodiment is equipped with a liquid crystal device, but alternatively it can be equipped with another electro-optical device such as an organic electroluminescent display and a plasma display.

In addition to the electronic apparatuses described above, the embodiment can be applied to various electronic apparatuses. Examples of these electronic apparatuses include: liquid crystal projectors, personal computers (PCs) and engineering work stations (EWS) for multimedia applications, pagers, word processors, televisions, video recorders of viewfinder types or direct monitor types, electronic notebooks, electric calculators, car navigations systems, point-of-sale (POS) terminals, and apparatuses equipped with a touch panel.

While the embodiments according to the invention have been described with reference to the accompanied drawings, it is needless to say that the invention is not limited to the above embodiments. The shapes, combinations and the like of each component member described in the foregoing embodiments are illustrative only, and various modifications may be made based on design requirement and the like within the scope of the invention.

For example, a bank structure having a desired pattern is formed by a lithographic treatment or etching in the above-described embodiments. Alternatively, a desired pattern may be formed by patterning with laser instead of the forming method described above.

Here, if the area of the first pattern forming region 55 is large enough compared to the diameter of a landed functional liquid, lyophobicity is not necessarily given to the bank 34. In this case, a functional liquid adequately wets and spreads in the regions 55 and 56 without performing a lyophobic treatment on them.

Figure 14:
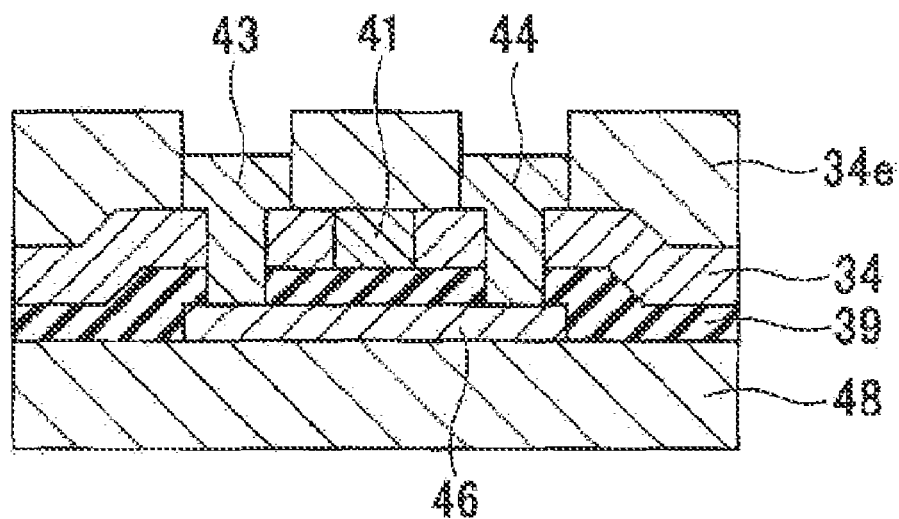
FIG. 14 is a sectional view schematically illustrating an example of an active matrix substrate.
Figure 15:
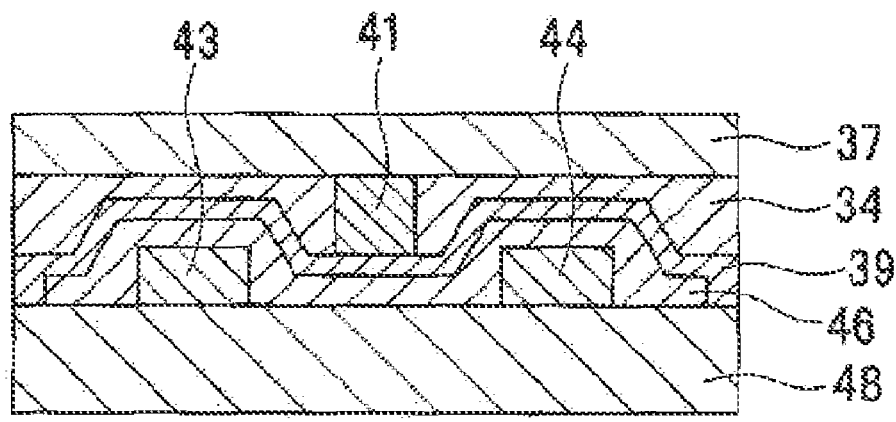
FIG. 15 is a sectional view schematically illustrating another example of an active matrix substrate.

The method for manufacturing a film pattern of the first embodiment also can be applied to manufacture an active matrix substrate as shown in FIGS. 14 and 15. Specifically, FIG. 14 is a schematic sectional view illustrating an example of an active matrix substrate including a transistor of a coplanar structure. In the substrate, a semiconductor layer 46 is formed on a substrate 48, and the gate electrode 41 is formed on the semiconductor layer 46 with the gate insulation film 39 interposed therebetween. The bank 34 surrounds the gate electrode 41 so as to define the pattern of the gate electrode 41. The bank 34 also functions as an interlayer insulation layer. Formed to the bank 34 and the gate insulation film 39 are contact holes as viewed in FIG. 14. The source electrode 43 is formed so as to connect to a source region of the semiconductor layer 46 through one contact hole, while the drain electrode 44 is formed so as to connect to a drain region of the semiconductor layer 46 through the other contact hole. To the drain electrode 44, a pixel electrode is connected.

FIG. 15 is a schematic sectional view illustrating an example of an active matrix substrate including a transistor of a stager structure. In the structure, the source electrode 43 and the drain electrode 44 are formed on the substrate 48, and the semiconductor layer 46 is formed on the source electrode 43 and the drain electrode 44. On the semiconductor layer 46, the gate electrode 41 is formed with the gate insulation film 39 interposed therebetween. The bank 34 surrounds the gate electrode 41 so as to define the pattern of the gate electrode 41. The bank 34 also functions as an interlayer insulation layer. To the drain electrode 44, a pixel electrode is connected.

When manufacturing the above-described active matrix substrates, the method for forming a film pattern of the embodiment can be applied. Namely, for example, when the gate electrode 41 is formed in a region surrounded by the bank 34, the gate electrode 41 can be formed with high reliability by applying the method for forming a film pattern according to the invention. Note that the method for forming a film pattern can be applied to processes to form not only a gate electrode, but also a source electrode, a drain electrode, and a pixel electrode.

What is claimed is:

1. A method for forming a film pattern, comprising:
disposing a first bank forming material to a substrate so as to form a first bank layer;
disposing a second bank forming material on the first bank layer so as to form a second bank layer; and
patterning the first bank layer and the second bank layer so as to form a bank including a pattern forming region having a first pattern forming region and a second pattern forming region, the second pattern forming region having a width larger than a width of the first pattern forming region, and being continuously formed from the first pattern forming region, wherein the first bank layer has a sidewall facing the pattern forming region and a first contact angle of less than 50 degrees with respect to a functional liquid containing $H_2O$ on the sidewall, and the second bank layer has a second contact angle larger than the first contact angle with respect to the functional liquid,
wherein the first and second bank materials are each composed of a main chain and a side chain, wherein the main chains each include a siloxane bond.

2. The method for forming a film pattern according to claim 1, wherein the pattern forming region has a bottom surface and a third contact angle of the first contact angle or less with respect to the functional liquid on the bottom surface.

3. The method for forming a film pattern according to claim 1, wherein the second contact angle is 50 degrees or more with respect to the functional liquid.

4. The method for forming a film pattern according to claim 1, wherein the side chain of the first bank material includes at least one group chosen from —H, —OH, —$(CH_2CH_2O)nH$, —COOH, —COOK, —COONa, —$CONH_2$, —$SO_3H$, —$SO_3Na$, —$SO_3K$, —$OSO_3H$, —$OSO_3Na$, —$OSO_3K$, —$PO_3H_2$, —$PO_3Na_2$, —$PO_3K_2$, —$NO_2$, —$NH_2$, —$NH_3Cl$, —$NH_3$≡Br, HNCl, and ≡NHBr.

5. The method for forming a film pattern according to claim 4, wherein the side chain further includes at least one of an alkyl group, an alkenyl group, and an aryl group.

6. The method for forming a film pattern according to claim 1, wherein the side chain of the second bank material includes at least one of an alkyl group, an alkenyl group, and an aryl group.

7. The method for forming a film pattern according to claim 1, wherein a thickness of the second bank layer is smaller than a thickness of the first bank layer.

8. The method for forming a film pattern according to claim 1 further comprising:
disposing a first functional liquid to the pattern forming region;
drying the first functional liquid in the pattern forming region so as to form a first dried film; and
disposing a second functional liquid on the first dried film, wherein a thickness of the first dried film is smaller than a thickness of the first bank layer.

9. The method for forming a film pattern according to claim 1 further comprising:
disposing a functional liquid to the pattern forming region;
drying the functional liquid in the pattern forming region so as to form a dried film; and
firing the bank and the dried film at once.

10. The method for forming a film pattern according to claim 9, wherein drying the functional liquid in the pattern forming region so as to form the dried film of a plurality of numbers, and firing the bank and the dried film of the plurality of numbers at once.

11. A method for manufacturing an active substrate, comprising:
(a) forming a gate wiring line on a substrate;
(b) forming a gate insulation film on the gate wiring line;
(c) depositing a semiconductor layer on the gate insulation film;
(d) forming a source electrode and a drain electrode on the gate insulation film;
(e) disposing an insulation material on the source electrode and the drain electrode; and
(f) forming a pixel electrode on the insulation material, wherein the method for forming a film pattern according to claim 1 is used in at least one of steps (a), (d), and (f).

12. A method for forming a film pattern, comprising:
disposing a first bank forming material to a substrate so as to form a first bank layer;
disposing a second bank forming material on the first bank layer so as to form a second bank layer;
patterning the first bank layer and the second bank layer so as to form a bank including a pattern forming region having a first pattern forming region and a second pattern forming region, the second pattern forming region having a width larger than a width of the first pattern forming region, and being continuously formed from the first pattern forming region, wherein the first bank layer has a sidewall facing the pattern forming region and a first contact angle of less than 50 degrees with respect to a functional liquid containing $H_2O$ on the sidewall, and the second bank layer has a second contact angle larger than the first contact angle with respect to the functional liquid;
disposing a first functional liquid to the pattern forming region;
drying the first functional liquid in the pattern forming region so as to form a first dried film; and
disposing a second functional liquid on the first dried film, wherein a thickness of the first dried film is smaller than a thickness of the first bank layer,
wherein the first and second bank materials are each composed of a main chain and a side chain, wherein the main chains each include a siloxane bond.

* * * * *